(12) United States Patent
Nakamura et al.

(10) Patent No.: US 8,167,687 B2
(45) Date of Patent: May 1, 2012

(54) METHOD OF THINNING WAFER AND SUPPORT PLATE

(75) Inventors: Akihiko Nakamura, Kanagawa (JP);
Atsushi Miyanari, Kanagawa (JP);
Yoshihiro Inao, Kanagawa (JP);
Yasumasa Iwata, Kanagawa (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 503 days.

(21) Appl. No.: 12/309,285

(22) PCT Filed: May 24, 2007

(86) PCT No.: PCT/JP2007/000557
§ 371 (c)(1),
(2), (4) Date: Feb. 25, 2009

(87) PCT Pub. No.: WO2008/007455
PCT Pub. Date: Jan. 17, 2008

(65) Prior Publication Data
US 2009/0325467 A1 Dec. 31, 2009

(30) Foreign Application Priority Data
Jul. 14, 2006 (JP) .................................. 2006-194692

(51) Int. Cl.
*B24B 1/00* (2006.01)
*B24B 41/06* (2012.01)
(52) U.S. Cl. ............................ 451/57; 451/388; 451/364
(58) Field of Classification Search ..................... 451/28, 451/41, 57, 364, 388
See application file for complete search history.

(56) References Cited

U.S. PATENT DOCUMENTS
6,422,922 B1 * 7/2002 Okamura et al. ............... 451/41
(Continued)

FOREIGN PATENT DOCUMENTS
| JP | 02-295154 A | 12/1990 |
| JP | 2001-185519 A | 7/2001 |
| JP | 2002-158193 A | 5/2002 |
| JP | 2005-150434 A | 6/2005 |
| JP | 2006-135272 A | 5/2006 |
| JP | 2007-73813 A | 3/2007 |

OTHER PUBLICATIONS

"International Applicational Application Serial No. PCT/JP2007/000557 mailed Jun. 19, 2007", 2 pgs.

*Primary Examiner* — Dung Van Nguyen
(74) *Attorney, Agent, or Firm* — Schwegman, Lundberg & Woessner, P.A.

(57) ABSTRACT

A wafer can be thinned without occurrences of dimples. A support plate 1 has a number of through holes 10. A circuit forming surface of a wafer 2 is adhered to one surface of the support plate by an adhesive member 4, and a dimple prevention member 3 having a thickness of 100 μm or more and having an adhesive layer 30 on one face is adhered to the other surface, thus the openings at both ends of the through holes 10 are blocked. The support plate is vacuum adsorbed to a support table through the dimple prevention member, and a non circuit-forming face of the wafer is ground/polished to thin the wafer. The dimple prevention member is stripped off, and a solvent is penetrated into the adhesive member through the through holes to detach the wafer from the support plate.

3 Claims, 17 Drawing Sheets

U.S. PATENT DOCUMENTS

| | | |
|---|---|---|
| 6,492,195 B2 * | 12/2002 | Nakanishi et al. ............ 438/106 |
| 6,513,796 B2 * | 2/2003 | Leidy et al. .................... 269/21 |
| 7,183,178 B2 | 2/2007 | Arai |
| 7,919,394 B2 * | 4/2011 | Nakamura et al. ............ 438/459 |
| 2001/0005043 A1 | 6/2001 | Nakanishi et al. |
| 2004/0235269 A1 * | 11/2004 | Kitamura et al. ............. 438/460 |
| 2005/0106840 A1 | 5/2005 | Arai |
| 2005/0170612 A1 * | 8/2005 | Miyanari et al. ............. 438/459 |
| 2005/0173064 A1 | 8/2005 | Miyanari |
| 2007/0054470 A1 | 3/2007 | Nakamura et al. |

* cited by examiner

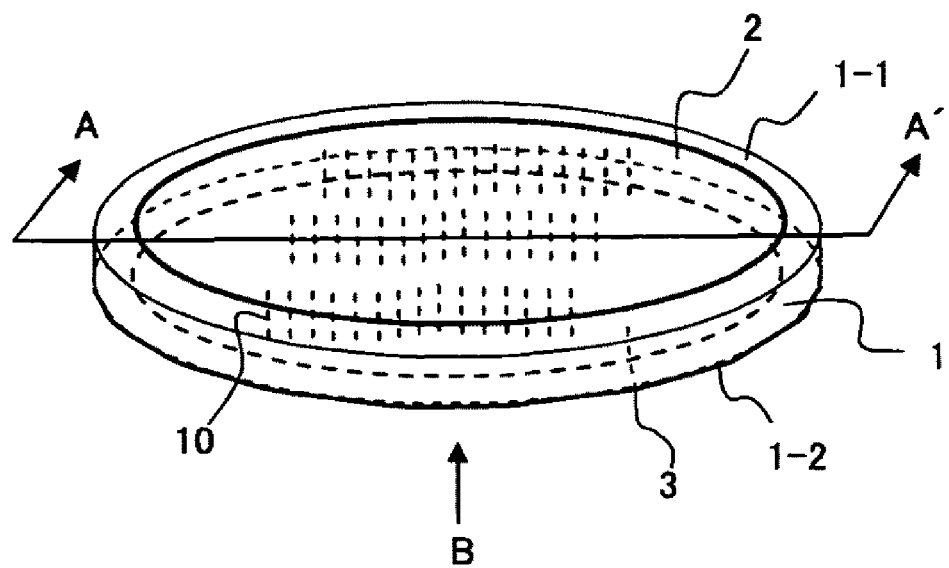
F I G. 1 A

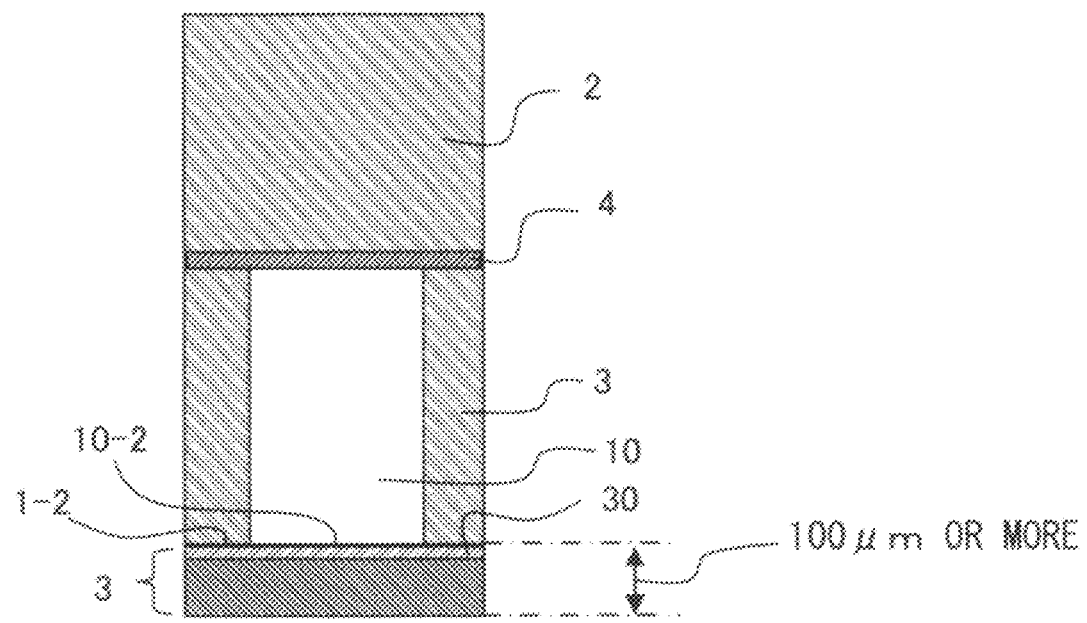
F I G. 1C

METHOD OF THINNING WAFER AND SUPPORT PLATE

RELATED APPLICATION

This application is a nationalization under 35 U.S.C. 371 of PCT/JP2007/000557, filed May 24, 2007 and published as WO 2008/007455 A1 on Jan. 17, 2008, which claimed priority under U.S.C. 119 to Japanese Application No. 2006-194692, filed Jul. 14, 2006; which applications and publication are incorporated herein by reference and made a part hereof.

TECHNICAL FIELD

The present invention relates to a method for thinning a wafer and a support plate, and more specifically to a support plate having through holes and a method for grinding/polishing a wafer adhered to the support plate into a thinner wafer.

BACKGROUND ART

With further development of thinner, smaller, and lighter portable equipment, a thinner semiconductor chip to be incorporated into the equipment is demanded.

The thickness of the current wafer used for the semiconductor chip is 125 µm through 150 µm, and the development of a thinner wafer of 25 µm through 50 µm has been realized.

The thinner wafer as above is produced by a grinding/polishing process for thinning the thickness of the wafer, a process of performing reverse side processing, etc., and is finally divided into a plurality of semiconductor chips.

When a wafer becomes thinner, the wafer cannot maintain its form by itself, and is easily bent or falls into difficulty in handling.

Therefore, the wafer is normally adhered to a hard supporting plate (hereinafter referred to as a support plate), and the wafer is handled with each support plate in each process.

Among the methods for thinning a wafer using the above-mentioned support plate, there is a method which includes a process of forming a film on the reverse side of the wafer after a grinding/polishing process.

In this case, a document discloses a method of embodying a thinner wafer by using a protection tape not to have an influence of contamination caused in the grinding/polishing process when the film is formed.

When the protection tape is used, the protection tape is adhered in advance on the reverse side of the support substrate (corresponding to the support plate) to which the semiconductor wafer is adhered, and the reverse side of the semiconductor wafer is ground/polished with the protection tape adhered.

Then, after the grinding/polishing process, the contaminants attached to the wafer and the support substrate are cleaned off, the protection tape is stripped off, and a film forming process is performed so that only a small number of contaminants are attached to the support substrate (for example, refer to patent document 1).

The support plate used when a wafer is thinned has been variously newly developed having, for example, through holes, a flat surface without holes, etc.

Among them, a support plate having the through holes is used when a wafer is adhered to the surface of the support plate by a material capable of moderating the adhering power later (for example, there is an adhesive etc. whose adhering power is moderated by alcohol, and the material group like this is referred to adhesive member hereafter.).

The through holes are formed as paths for a dissolving solution (detaching solution) for detaching the wafer once adhered from the support plate, and arranged in a range of an openings in which the wafer is adhered to the support plate.

In each of the processes during producing a semiconductor, the wafer is handled by a working robot holding the support plate, and fixed to a predetermined position by the vacuum adsorption, electrostatic adsorption, etc. on the reverse side of the support plate.

However, when the support plate of this type is used, there has been the problem that dimples occur at the positions corresponding to the through holes on the surface of the wafer after detached from the support plate.

FIG. 6 is a perspective view of the wafer on which the dimples occur. As shown in FIG. 6, a number of dimples 90 occur on a surface 9-1 of a wafer 9.

The dimples 90 can be caused by, for example, a grinding/polishing device fixes a support plate not shown in the attached drawings but adhered to the surface 9-1 onto the table with the wafer 9 facing upward by vacuum adsorption to grind/polish the wafer 9 into a thinner plate by pushing down a grinding wheel etc. onto an exposed surface (reverse side of the wafer) 9-2 of the wafer 9 from above the wafer 9 as follows.

First, the adhesive member not shown in the attached drawings but interposed between the wafer 9 and the support plate by the pressing force of a grinding wheel etc. is depressed at the opening of the support plate. Second, the adhesive member is taken into the opening of the support plate through the through holes by the vacuum adsorption of the reverse side of the support plate, thereby generating the dimples.

Patent Document 1: Japanese Published Patent Application No. 2005-150434

DISCLOSURE OF THE INVENTION

To solve one of the above-mentioned problems, the method of thinning a wafer according to the present invention and the support plate are configured as follows.

One of the aspects of the method of thinning a wafer according to the present invention is realized by a dimple prevention member having a thickness of 100 µm more to block openings of through holes in a surface of a support plate on which the wafer is adhered by an adhesive member in the area where the wafer does not contact, thereby applying vacuum adsorption to the support plate through the dimple prevention member and grinding/polishing the wafer.

Furthermore, when the support plate is detached from the wafer after the grinding/polishing, the dimple prevention member is first removed, and then a predetermined detaching solution is made to contact the adhesive member through the through holes to detach the support plate from the wafer.

In addition, it is desired that a tape is used as the dimple prevention member, and that the tape blocks all of the openings of the through holes formed on the surface of the support plate to which the wafer is not adhered. It is also desired that the tape on the surface of the support plate is adhered so that the tape can be adhered evenly on the surface of the support plate not to make a step with the surface.

In one of the aspects of the support plate according to the present invention, a support plate for supporting the surface of a wafer with an adhesive member interposed includes through holes having openings in a range of close contact of the wafer, and a removable dimple prevention member having a thickness of 100 µm or more for blocking second openings (openings opposite the above-mentioned openings) of the through holes leading to the openings.

It is also desired that the dimple prevention member is a tape to be adhered to the support plate by adhering power, and it is further desired that the tape is configured in size to completely cover the second openings. It is desired that the tape is evenly adhered on one surface of the support plate not to generate a step with the surface of the support plate.

In the present invention, the dimple prevention member having the thickness of 100 μm or more blocks the openings (second openings) of the through hole openings in the support plate on the side to which the wafer is not adhered before grinding/polishing the wafer on the support plate by vacuum adsorption to the support plate, or the support plate whose openings are blocked by the dimple prevention member having the thickness of 100 μm or more is prepared in advance.

Thus, in the grinding/polishing process, the internal space of the through holes is tightly closed, and the thickness of 100 μm or more additionally works, thereby the depression of the adhesive member by the pressing force etc. of the grinding wheel etc. at the opening, or the take-in of the adhesive member by vacuum adsorption can be reduced.

According to the present invention, the occurrence of dimples on the surface of a wafer can be greatly suppressed. That is, the wafer at the openings opposite the through holes whose openings are blocked by the dimple prevention member does not generate dimples, and a semiconductor chip of high degree of flatness and high precision can be extracted from the wafer at the position.

BRIEF DESCRIPTIONS OF THE DRAWINGS

FIG. 1A shows an example (1) of the configuration of the support plate for use in the grinding/polishing process according to the present invention;

FIG. 1C shows an example (3) of the configuration of the support plate for use in the grinding/polishing process according to the present invention;

Figure 1B:
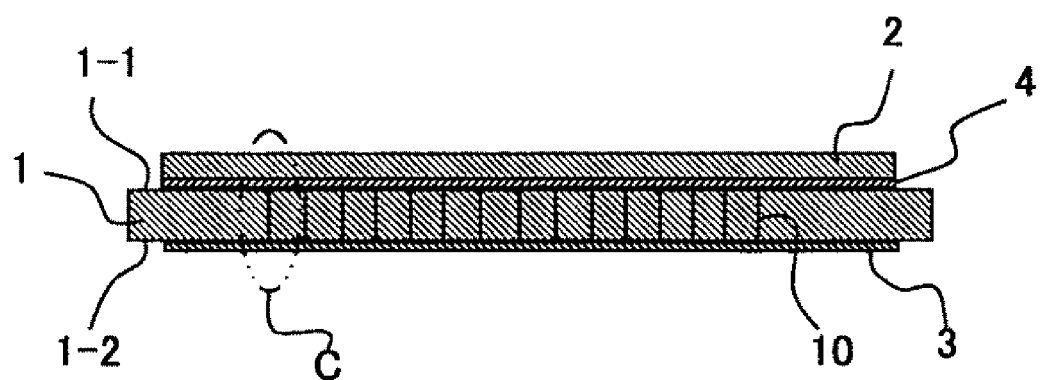
FIG. 1B shows an example (2) of the configuration of the support plate for use in the grinding/polishing process according to the present invention.

DESCRIPTION OF REFERENCE NUMERALS 1 support plate
2 wafer
3 dimple prevention member
4 adhesive member
10 through holes
30 adhesive layer

BEST MODE FOR CARRYING OUT THE INVENTION

The best mode for carrying out the present invention is described below in detail with reference to the attached drawings.

FIGS. 1A through 1D are the examples of a support plate configuration utilized in a grinding/polishing process according to the present invention.

FIGS. 1A through 1D show a support plate to which a wafer is adhered for easy understanding of the arrangement of each component.

FIG. 1A is a perspective view of the support plate with the entire configuration clearly shown using a transparent view.

A support plate 1 according to an embodiment of the present invention is disk-shaped and has a predetermined thickness in a vertical direction as shown in FIG. 1, and an upper surface 1-1 and a lower surface 1-2 are flat.

The support plate 1 has a wafer 2 adhered on the upper surface 1-1 with an adhesive member not shown in the attached drawings, and supports the wafer 2 on the surface. The support plate 1 has a dimple prevention member 3 adhered on the lower surface 1-2.

The support plate 1 has through holes 10 in the direction of the thickness of the support plate 1 (from the upper surface 1-1 to the lower surface 1-2).

A plurality of through holes 10 are formed in the range of the close contact of the wafer 2 on the upper surface 1-1 of the support plate, and one end of each of the through holes 10 is open in the range of the close contact on the upper surface 1-1 of the support plate (the opening is referred to as a first opening).

The other end of each of the through holes 10 is open at the lower surface 1-2 of the support plate (the opening is referred to as a second opening).

The number and arrangement of the through holes 10 are 15 through holes 10 in each of the three rows in FIG. 1A, but this drawing is devised only for readability of the through holes from the drawing. Practically, the holes are formed at high density at equal intervals or at random intervals over the entire close contact range of the wafer 2.

Since the above through holes are designed in a conventional configuration, their functions are not described here in detail, but they are used as the paths of a dissolving solution (detaching solution) for use in solving the adhesive member between the support plate and the wafer after various processes such as a wafer grinding/polishing process, a reverse side forming process, etc.

FIG. 1B is a sectional view along the line A-A' indicated by the arrows shown in FIG. 1A. As shown in FIG. 1B, the support plate 1 according to the present embodiment has the thick wafer 2 before the grinding/polishing process and adhered to the support plate 1 via an adhesive layer 4 with an adhesive member thinly extended on the upper surface.

In the support plate 1, a plurality of through holes 10 (15 through holes in FIG. 1B) extend from the upper surface 1-1 toward the lower surface 1-2, and the dimple prevention member 3 is attached to the end of the lower surface 1-2.

As a dimple prevention member, material capable of allowing the dimple prevention member 3 to be removed from the support plate 1 (for example, a tape having an adhesive side) is used.

The implementation of the tape to the support plate when the tape is used as a dimple prevention member is performed by applying the adhesive face of the tape to the lower surface 1-2 of the support plate.

The removal of the tape from the support plate is performed by stripping off (removing) the tape from the support plate along with the entire adhesive layer of the tape.

To attain the dimple prevention effect, the thickness of the dimple prevention member 3 is to be 100 µm or more.

Therefore, a tape whose thickness is designed as 100 µm or more is used for the dimple prevention member 3 of the present embodiment.

FIG. 1C is an enlarged view of the range C shown in FIG. 1B. As shown in FIG. 1C, the dimple prevention member 3 is configured by a tape having a adhesive layer 30 on the upper surface, and is adhered to the lower surface 1-2 of the support plate to block a second opening 10-2 of each of the through holes 10.

Figure 1D:
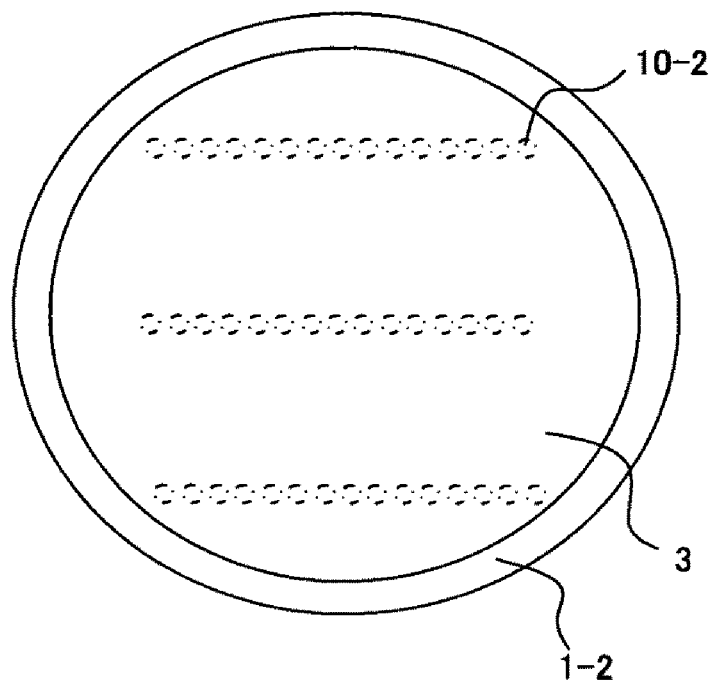
FIG. 1D shows an example (4) of the configuration of the support plate for use in the grinding/polishing process according to the present invention.

FIG. 1D is a view of FIG. 1A in the direction of the arrow B, that is, the bottom view of FIG. 1A. FIG. 1D shows the second openings 10-2 of the through holes 10 hidden by the dimple prevention member 3 by broken lines so that the relationship between the positions of the second openings 10-2 of the through holes 10 and the attaching range of the dimple prevention member 3 can be clearly shown.

The dimple prevention effect of the dimple prevention member 3 can work even if the dimple prevention member 3 is adhered to the lower surface 1-2 of the support plate so that the second openings 10-2 of a part of the through holes 10 are blocked.

However, to obtain the dimple prevention effect more correctly, it is desired that all the second openings 10-2 of the through holes having the first openings in the close contact area shall be completely blocked (for example in the arrangement shown in FIG.

As described above, by blocking all of the second openings 10-2, the dimple prevention effect can be furthermore improved. Practically, by blocking all of the second openings 10-2, the occurrences of dimples can be suppressed in the area on the wafer where the first openings of the through holes are located. That is, the oblateness of the wafer of the area can be enhanced.

Therefore, if all of the second openings 10-2 of the through holes having the first openings in the close contact area of the wafer are completely blocked, a high oblateness can be obtained in all range of the wafer, and more semiconductor chips of high precision can be extracted from the wafer.

Therefore, it is preferable that the size of the dimple prevention member is large enough to completely cover all of the second openings.

The support plate 1 shown in the present embodiment is designed to have about 1 mm larger in diameter than 12 inches so as to be applied to all wafers of 6, 8, and 12 inches in size.

The support plate 1 is designed to have the thickness of about 500 through 1000 µm, and the through holes are designed to have the diameter of about 400. through 500 µm.

The material of the support plate 1 can be glass, but also can be an alloy of iron and nickel (an alloy containing 36% nickel: Invar), a ceramic plate, etc.

In consideration of the case where a liquid such as water etc. is taken in for cleansing or cooling during processing, a material having the insolubility in the above liquid so that the wafer cannot be detached from the support plate and having the solubility in a detaching solution can be selected for an adhesive member for adhering a wafer to a support plate.

Also in consideration of the case where there is a possibility of receiving a splash of a liquid such as water etc. for cleansing or cooling during processing, a material that has the insolubility in the above liquid and can be easily stripped off by a user hand is selected and used as the dimple prevention member.

The above-mentioned design information is only examples, and appropriate design can be devised depending on the size of the wafer to be processed, the types of chemicals to be used in the device, etc.

In the above-mentioned examples, the second openings of the through holes are provided on the bottom surface of the support plate. The following descriptions are based on this example. However, when the support plate has some thickness and side surface have the second openings, the second openings on side surface of the support plate can be blocked by the dimple prevention member.

When a support plate having the second openings in other areas is used, the second openings can be similarly blocked by the dimple prevention member. In this case, the dimple prevention effect works when vacuum induction is performed through the through holes.

(Embodiment) 1

Described in the present embodiment is the method of using the dimple prevention member.

FIGS. 2A through 2I are explanatory views of the entire flow of the thinning process of a wafer when the above-mentioned dimple prevention member is used.

Figure 2A:
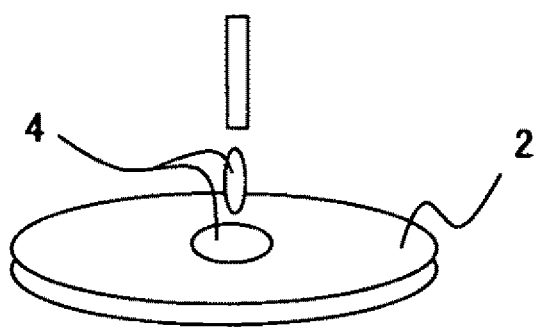
FIG. 2A is a chart (1) showing the process of thinning a wafer using a dimple prevention member.

First, an adhesive liquid (adhesive member) 4 is dropped on the surface (on which a circuit is formed) of the wafer 2, a spinner not shown in the attached drawings rotates to spread the adhesive liquid 4 thinly on the surface of the wafer 2 (FIG. 2A). The adhesive liquid 4 can be, for example, a material of a phenol resin series of a novolac type.

Figure 2B:
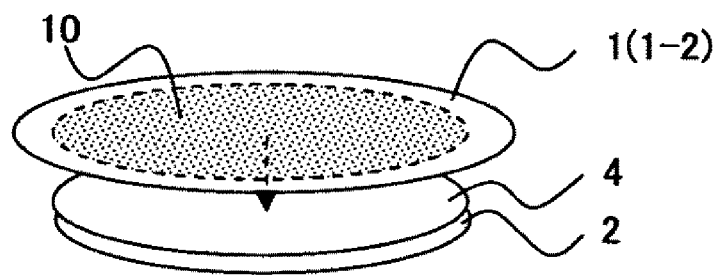
FIG. 2B is a chart (2) showing the process of thinning a wafer using a dimple prevention member.

Next, the adhesive liquid 4 on the surface of the wafer 2 is preparatorily dried to reduce the liquidity, and the support plate 1 is adhered to the layer 4 of the adhesive liquid (FIG. 2B).

An oven is used when the liquid is preparatorily dried. The liquid is heated at 80° C. for 5 minutes for example. The thickness of the adhesive layer 4 is determined depending on the height of the circuit formed on the surface of the wafer 2.

Figure 2C:
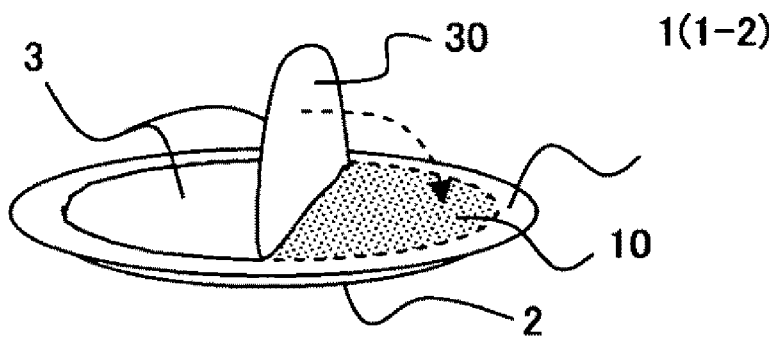
FIG. 2C is a chart (3) showing the process of thinning a wafer using a dimple prevention member.

Next, the dimple prevention member (an adhesive tape is used in the present embodiment) 3 having the thickness of 100 µm or more is adhered to the surface (referred to as a lower surface in the present embodiment) 1-2 to which the wafer 2 of the support plate 1 is not closely adhered (FIG. 2C).

In this adhering method, the adhesive surface 30 is made to face the lower surface 1-2 of the support plate 1, and the surfaces 30 are adhered to the lower surface 1-2 so that all of the openings (second openings indicated by dots in FIG. 2C) of the through holes 10 of the support plate 1 arranged in the circle (enclosed by the broken line in FIG. 2C) having the smaller diameter than the outer diameter of the lower surface 1-2 of the support plate can be completely blocked.

Thus, since the adherence range of the dimple prevention member can be a range in which the second openings exist (indicated by the dotted range in FIG. 2C), it is not necessary to cover the range containing no second openings near the edge. That is, it is not necessary to cover the entire lower surface 1-2 of the support plate.

On the other hand, when there are the second openings not only in the lower surface 1-2 of the support plate, but also in other surfaces (for example, side surfaces, or the area not closely in contact with the wafer 2 of the upper surface 1-1, etc.), the second openings are to be positively covered.

Although it is preferable that the dimple prevention member 3 covers all of the second openings, it is acceptable that only a part of the second openings can be covered.

In any case, the occurrences of dimples can be suppressed at the openings (first openings) on the close contact area side of the wafer 2 of the through holes 10 having the second openings covered with the dimple prevention member 3.

Therefore, the semiconductor chip in the area has a higher oblateness than other areas, and a high precision semiconductor chip can be extracted from the area.

In the present embodiment, the dimple prevention member 3 is laminated after thorough drying of the adhesive layer 4 between the support plate 1 and the wafer 2.

It is necessary to completely dry the adhesive layer 4 because if the adhesive layer 4 is insufficiently dried, the adhesive material 4 comes in contact with the dimple prevention member 3 through the through holes 10 depending on the size of the diameter of the through holes 10, and there can be an undesired case in which it is difficult to remove the dimple prevention member 3 as described later.

However, the undesired case as above can be avoided by changing various design settings such as sufficiently downsizing the diameter of the through holes, reducing the amount of the adhesive material, or enlarging the length of the through holes, etc.

The dimple prevention member 3 can be adhered at any time before the following grinding/polishing process is performed.

In addition, for example, it is also possible to use from the beginning the support plate 1 to which the dimple prevention member 3 shown in FIG. 1 is implemented.

Figure 2D:
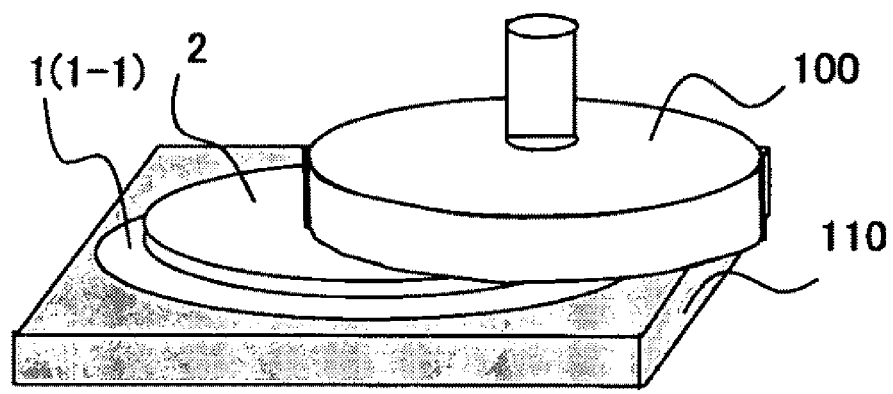
FIG. 2D is a chart (4) showing the process of thinning a wafer using a dimple prevention member.

Next, the support plate 1 to which the dimple prevention member is laminated is inverted (that is, the exposed surface of the wafer 2 face is upward), and the exposed surface (referred to as the reverse side in the present embodiment) is ground/polished (FIG. 2D).

In this process, a grinding wheel 100 is lowered from above the exposed surface of the wafer 2, and the exposed surface is thinly chipped while pressing the surface with the grinding wheel 100.

Figure 3:
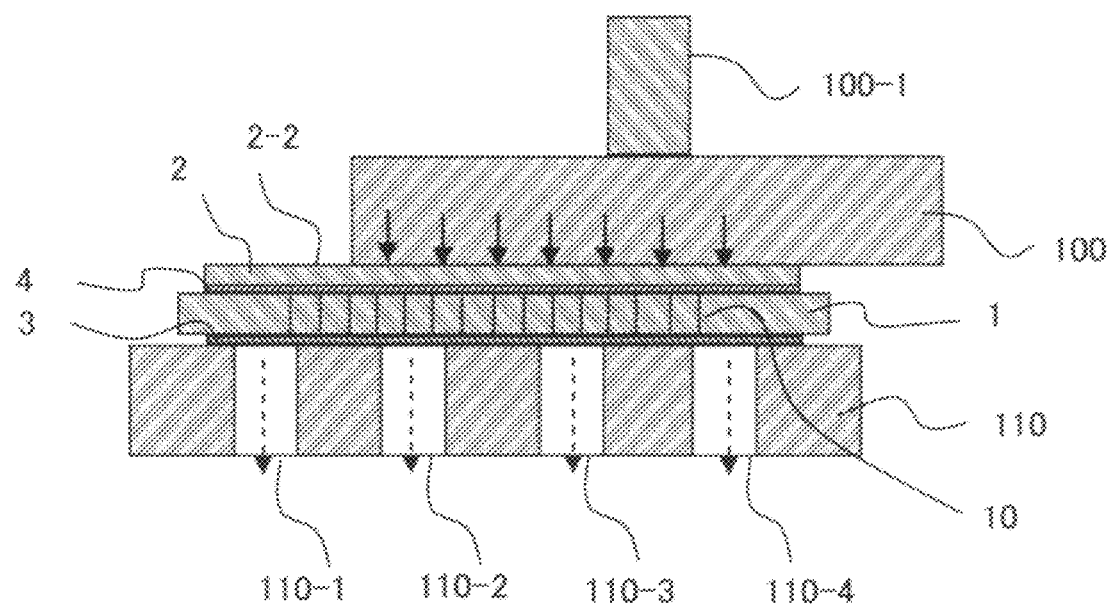
FIG. 3 is a sectional view of a schematic diagram of the grinding/polishing device.

FIG. 3 is a sectional view of a schematic diagram of the grinding/polishing device. As shown in FIG. 3, the support plate 1 to which the dimple prevention member 3 is attached is placed on the table with the exposed surface 2-2 facing upward, and the grinding wheel 100 is pushed down.

In the present embodiment, vacuum inducing holes (110-1 through 110-4) are formed on a table 110. The dimple prevention member 3 adhered to the lower surface 1-2 of the support plate 1 is vacuum induced in the direction of the arrow in broken lines. Thus, the support plate 1 is adsorbed to the upper surface of the table 110 and fixed thereto.

The grinding wheel 100 applies predetermined pressing force to the exposed surface 2-2 of the wafer in the direction of the arrow in the solid lines shown in FIG. 3 while rotating about the rotation axis 100-1 as the central axis, and evenly grinds the exposed surface 2-2.

Thus, the thickness of the wafer 2 is reduced to the range of, for example, 125 μm through 150 μm, and further 25 μm through 50 μm if requested.

During grinding, there arises friction heat between the wafer 2 and the grinding wheel 100. Therefore, water is supplied to the exposed surface of the wafer 2, thereby suppressing heat.

During the process, the dimple prevention member 3 on the lower surface of the support plate 1 blocks the through holes 10 of the support plate 1.

Therefore, the fluctuation of the internal pressure of the through holes 10 is largely moderated, thereby also largely moderating the depression of the adhesive member 4 between the wafer 2 and the support plate 1 into the through holes 10 (causing the occurrence of dimples).

Back in FIG. 2D, the process after the grinding/polishing process is described below.

Figure 2E:
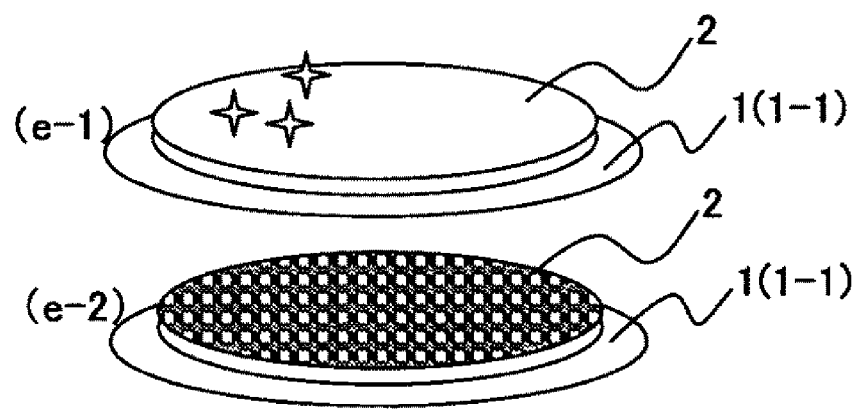
FIG. 2E is a chart (5) showing the process of thinning a wafer using a dimple prevention member.

In the next process, the wafer 2 thinned in the grinding/polishing process is treated by reverse side processing (FIG. 2E).

The reverse side processing can be, for example, the back-metallizing process shown at the upper portion in FIG. 2E, or the circuit forming process shown at the lower portion in FIG. 2E. These processes can be omitted as necessary.

The above-mentioned reverse side processing is performed with the dimple prevention member 3 attached to the support plate 1. Thus, in this process, the invasion of polluting factors to the through holes 10 of the support plate 1, the clogging of the through holes 10 by the invasion, etc. can be avoided by the dimple prevention member 3.

Figure 2F:
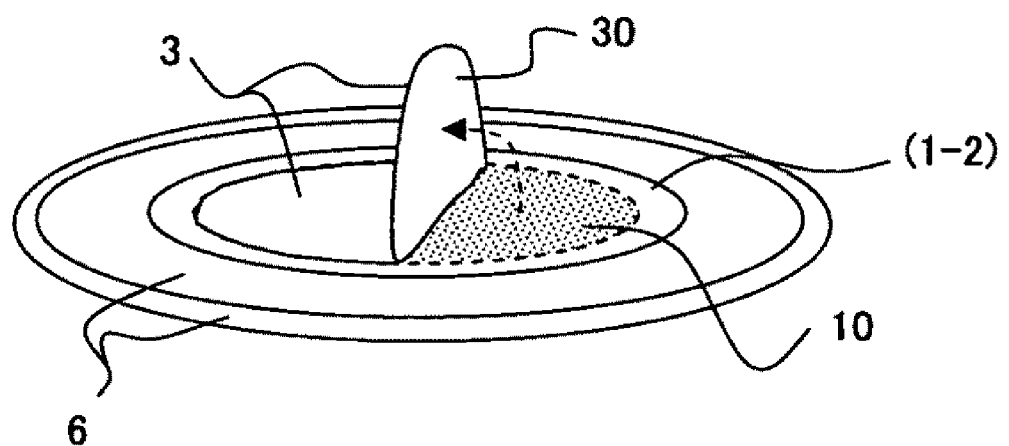
FIG. 2F is a chart (6) showing the process of thinning a wafer using a dimple prevention member.

Next, the exposed surface of the wafer 2 is adhered to an adhesive dicing tape 6. Then, the dimple prevention member 3 attached to the reverse side is detached from the lower surface 1-2 of the support plate 1 (FIG. 2F).

Since an adhesive tape is used as the dimple prevention member 3 in the present embodiment, no specific solvent is used, and the dimple prevention member 3 can be detached easily by a user.

By detaching the dimple prevention member 3, one ends (second openings) of the through holes 10 which have been blocked by the dimple prevention member 3 are released again.

Thus, the through holes 10 can be used as the paths of the detaching solution. Therefore, the dimple prevention member 3 can be removed (detached) at an arbitrary timing between the reverse side processing of the wafer 2 and the detaching process described later.

Figure 2G:
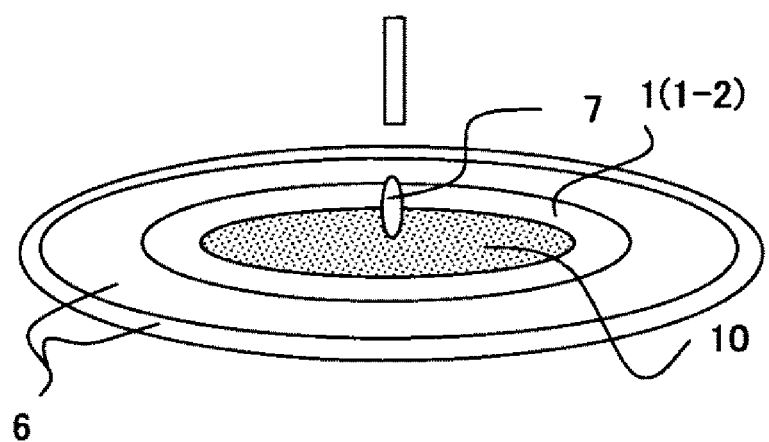
FIG. 2G is a chart (7) showing the process of thinning a wafer using a dimple prevention member.

Next, detaching solution is dropped down on the surface of the support plate from which the dimple prevention member 3 has been peeled off, and the detaching solution penetrate into the adhesive layer 4 between the upper surface 1-1 of the support plate and the surface of the wafer 2 through the through holes 10 (FIG. 2G).

Figure 4:
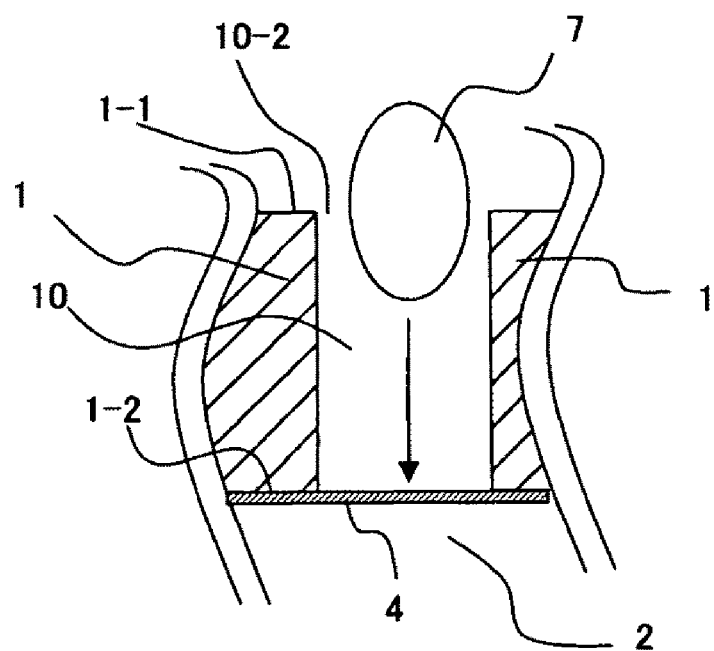
FIG. 4 shows the state of through holes when a detaching solution is penetrated.

FIG. 4 shows the status of the through hole 10 when the detaching solution 7 penetrate into the adhesive layer 4.

In FIG. 4, the upper surface 1-1 of the support plate 1 is the surface on which the dimple prevention plate 3 has been adhered, and the bottom surface 1-2 is the contact surface with the adhesive layer 4 on which the wafer 2 is stuck firmly.

In the previous process, the dimple prevention plate is detached so that the second openings 10-2 of the through holes 10 are opened. Thus, the detaching solution 7 can penetrate into the adhesive layer 4 through the second openings 10-2.

The detaching solution 7 contact with the adhesive member 4, and deteriorate the adhesive power of the adhesive member 4. When the detaching solution 7 penetrate all over the adhesive layer 4, the wafer 2 and the support plate 1 can be separated more reliably.

As the detaching solution, alcohol (especially low molecular weight alcohol such as ethanol or methanol), ketone, or the mixture of alcohol and ketone is used.

Figure 2H:
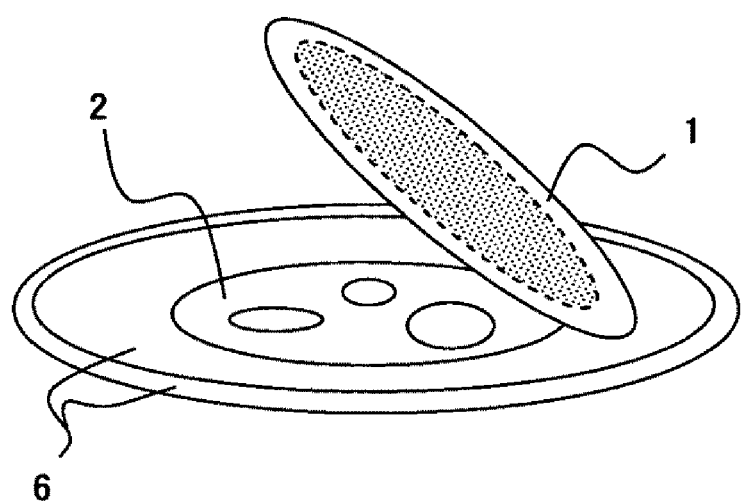
FIG. 2H is a chart (8) showing the process of thinning a wafer using a dimple prevention member.

Next, if the adhesion level between the wafer 2 and the support plate 1 becomes sufficiently low, the support plate 1 is detached from the wafer 2 adhered to the dicing tape 6 (FIG. 2H).

Figure 2I:
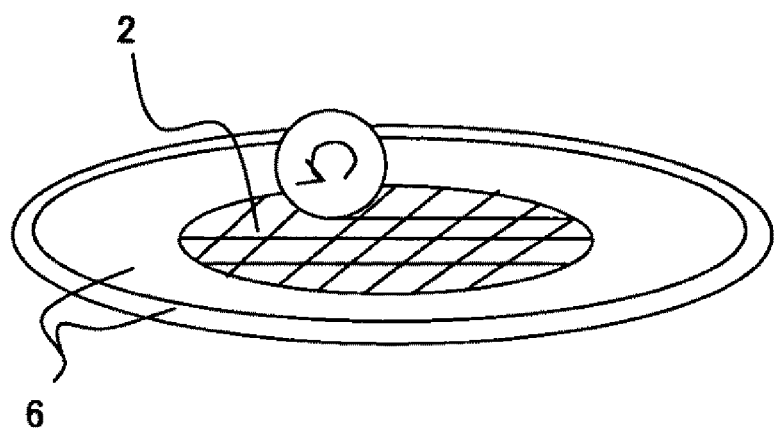
FIG. 2I is a chart (9) showing the process of thinning a wafer using a dimple prevention member.

Then, the wafer 2 is divided into chip size by the dicing device (FIG. 2I). The adhesion of each of the divided semiconductor chips is degraded by the ultraviolet irradiated on the dicing tape 6. Thus, each of the divided chips can be individually picked up.

Figure 5:
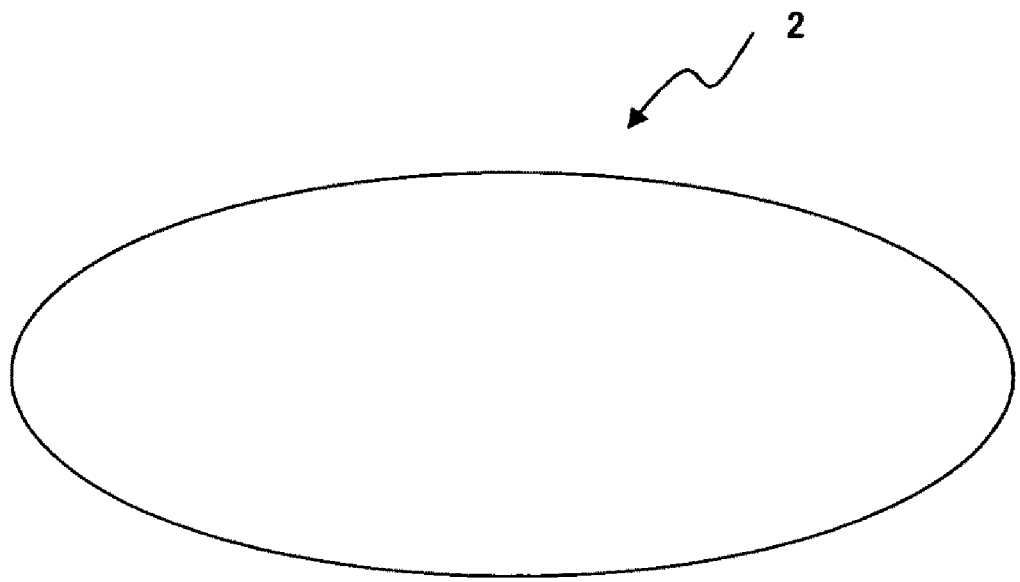
FIG. 5 shows the state of the surface of the thinned wafer.
Figure 6:
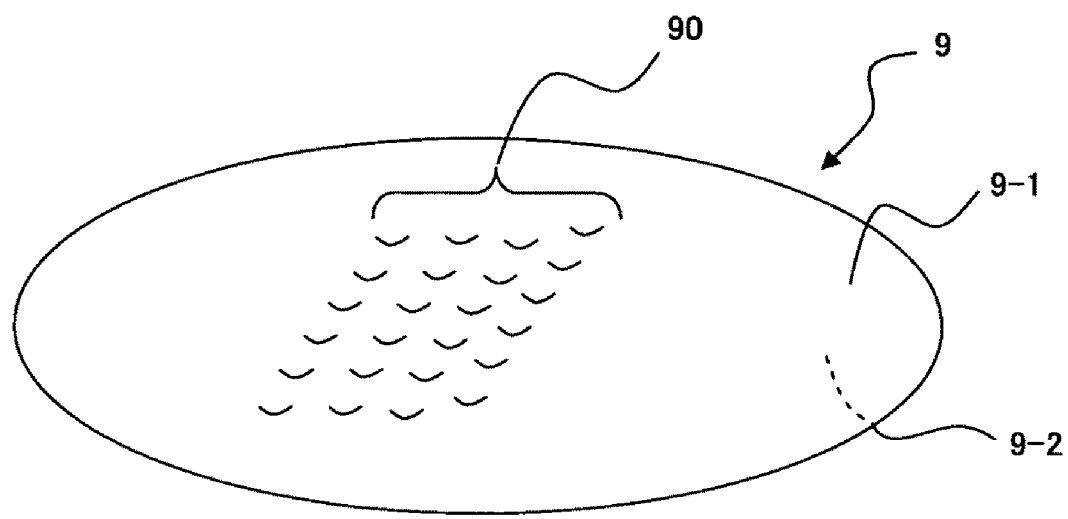
FIG. 6 shows the state of the surface of the wafer on which dimples occur.

FIG. 5 shows the surface state after the support plate of the wafer 2 is detached. As shown in FIG. 5, the surface of the wafer 2 is smooth without dimples, and a semiconductor chip of high oblateness and high precision can be extracted from the entire surface of the wafer in the later process.

Described above are examples of the support plate and the method of using it according to the present invention. An example of the method of adhering the dimple prevention member adhered to the support plate is included in the examples. Therefore, other adhering methods can also be appropriately used.

For example, if a step is formed on the surface of a support plate depending on the material and thickness of the dimple prevention member and an occurrence of a faulty condition by the step is expected, then a dimple prevention member having the same diameter size as the support plate is evenly applied on the surface of the support plate. Thus, a faulty condition by a step can be suppressed.

As described above, the internal space of through holes can be tightly closed by adhering the dimple prevention member. By a further effect of the thickness of 100 µm or more of the dimple prevention member, the problems of the depression of an adhesive member into an opening by the pressing force of a grinding wheel etc. and the take-in of the adhesive member into the opening by vacuum induction can be considerably solved in the grinding/polishing process.

When the reverse side processing is performed, the polluting factors generated in the course of the reverse side processing can be prevented from entering the through holes.

Thus, by adhering the dimple prevention member to the support plate, the occurrences of dimples on the surface of a wafer can be greatly suppressed, the undesired influence of polluting factors can be reduced, and semiconductor chips of high oblateness and high precision can be extracted from a wider range of the wafer.

The invention claimed is:

1. A method of thinning a wafer, comprising:
blocking openings of through holes on a surface where the wafer is not adhered by an adhesive member on the support plate with a dimple prevention member having a thickness of 100 µm or more, the plate having opening holes adhered closely by the wafer via an adhesive member; and
grinding/polishing the wafer while applying vacuum adsorption to the support plate through the dimple prevention member,
removing the dimple prevention member after grinding/polishing,
detaching the support plate from the wafer by a predetermined detaching solution being made to contact the adhesive member through the through holes, and
using a tape as the dimple prevention member to block all openings of the through holes formed on the surface of the support plate to which the wafer is not adhered.

2. A method of thinning a wafer, comprising:
blocking openings of through holes on a surface where the wafer is not adhered by an adhesive member on the support plate with a dimple prevention member having a thickness of 100 µm or more, the plate having opening holes adhered closely by the wafer via an adhesive member;
grinding/polishing the wafer while applying vacuum adsorption to the support plate through the dimple prevention member; and
using a tape as the dimple prevention member to block all openings of the through holes formed on the surface of the support plate to which the wafer is not adhered.

3. A support plate supporting a surface of a wafer with an adhesive member interposed, comprising:
through holes having openings in a range of close contact of the wafer;
a removeable dimple prevention member having a thickness of 100 µm or more for blocking second openings of the through holes leading to the openings;
wherein the dimple prevention member is a tape to be adhered to the support plate by adhering power; and
the tape is configured in size to completely cover the second openings.

* * * * *